(12) United States Patent
Cork et al.

(10) Patent No.: US 8,638,102 B2
(45) Date of Patent: Jan. 28, 2014

(54) PARAMETRIC AMPLIFIER DEVICE

(75) Inventors: Peter Cork, Romsey (GB); Anthony Peter Hulbert, Southampton (GB); John Hunt, Southhampton (GB)

(73) Assignee: Siemens Aktiengesellschaft, Munich (DE)

( * ) Notice: Subject to any disclaimer, the term of this patent is extended or adjusted under 35 U.S.C. 154(b) by 540 days.

(21) Appl. No.: 12/753,132

(22) Filed: Apr. 2, 2010

(65) Prior Publication Data
US 2010/0253349 A1 Oct. 7, 2010

(30) Foreign Application Priority Data

Apr. 3, 2009 (GB) .................................. 0905770.4
Sep. 8, 2009 (GB) .................................. 0915653.0

(51) Int. Cl.
*G01V 3/00* (2006.01)
(52) U.S. Cl.
USPC ........................................................ 324/322
(58) Field of Classification Search
USPC ................................................. 324/300–322
See application file for complete search history.

(56) References Cited

U.S. PATENT DOCUMENTS

| | | | |
|---|---|---|---|
| 3,611,110 A | 10/1971 | Corbey | |
| 3,824,482 A | 7/1974 | Whelehan, Jr. | |
| 3,919,656 A * | 11/1975 | Sokal et al. ..................... | 330/51 |
| 4,387,470 A | 6/1983 | Maurer et al. | |
| 4,949,044 A * | 8/1990 | Starewicz et al. ............. | 324/320 |
| 5,245,288 A | 9/1993 | Leussler | |
| 5,384,536 A | 1/1995 | Murakami et al. | |
| 6,291,994 B1 * | 9/2001 | Kim et al. ..................... | 324/300 |
| 6,906,520 B2 | 6/2005 | Heid et al. | |
| 6,982,554 B2 * | 1/2006 | Kurpad et al. ................ | 324/318 |
| 7,123,009 B1 | 10/2006 | Scott | |
| 7,123,090 B2 | 10/2006 | Ratzel | |
| 7,323,876 B2 | 1/2008 | Den Boef | |
| 7,358,737 B2 * | 4/2008 | Hoult ............................. | 324/322 |
| 7,417,433 B2 | 8/2008 | Heid et al. | |
| 7,622,928 B2 | 11/2009 | Gauss et al. | |
| 7,701,220 B2 | 4/2010 | Ehnholm | |
| 7,750,630 B2 | 7/2010 | Van Helvoort et al. | |
| 7,750,635 B2 | 7/2010 | Van Helvoort et al. | |
| 7,777,492 B2 | 8/2010 | Vernickel et al. | |
| 7,952,408 B2 * | 5/2011 | Eisenstadt et al. ............ | 327/231 |
| 8,031,003 B2 * | 10/2011 | Dishop ........................ | 330/276 |
| 8,130,039 B2 * | 3/2012 | Dishop ........................ | 330/276 |
| 8,525,518 B1 * | 9/2013 | Qian ........................... | 324/322 |
| 2003/0206019 A1 | 11/2003 | Boskamp | |
| 2007/0013376 A1 | 1/2007 | Heid et al. | |

(Continued)

FOREIGN PATENT DOCUMENTS

DE 103 04 861 8/2004
GB 1132545 1/1967

OTHER PUBLICATIONS

U.S. Appl. No. 12/874,706, filed Sep. 2, 2010.
U.S. Appl. No. 12/726,567, filed Mar. 18, 2010.

(Continued)

*Primary Examiner* — Dixomara Vargas
(74) *Attorney, Agent, or Firm* — Schiff Hardin LLP

(57) ABSTRACT

A parametric amplifier device has a two port parametric amplifier, a DC voltage generator and a DC bias regulator. The bias regulator has a voltage regulator, an attenuator and a summer. Output voltages from the regulator and the attenuator are added in the summer.

4 Claims, 5 Drawing Sheets

(56) References Cited

U.S. PATENT DOCUMENTS

| | | |
|---|---|---|
| 2007/0176601 A1 | 8/2007 | Adachi |
| 2007/0188175 A1 | 8/2007 | Burdick, Jr. et al. |
| 2007/0207763 A1 | 9/2007 | Bollenbeck et al. |
| 2008/0157769 A1 | 7/2008 | Renz et al. |
| 2008/0246477 A1 | 10/2008 | Nakabayashi |
| 2009/0286478 A1 | 11/2009 | Biber et al. |
| 2010/0253346 A1 | 10/2010 | Hulbert |

OTHER PUBLICATIONS

U.S. Appl. No. 12/753,159, filed Apr. 2, 2010.
U.S. Appl. No. 12/753,150, filed Apr. 2, 2010.
U.S. Appl. No. 12/753,134, filed Apr. 2, 2010.
U.S. Appl. No. 12/753,148, filed Apr. 2, 2010.
U.S. Appl. No. 12/753,138, filed Apr. 2, 2010.
"Behavioral Modeling and Simulation of a Parametric Power Amplifier," Gray et al., IMS (2009) pp. 1373-1376.

* cited by examiner

PARAMETRIC AMPLIFIER DEVICE

BACKGROUND OF THE INVENTION

1. Field of the Invention

This invention relates to a parametric amplifier device, in particular for use in magnetic resonance imaging (MRI) systems.

2. Description of the Prior Art and Related Subject Matter

MRI scanners use a combination of a strong constant magnetic field ($B_0$) from a superconducting magnet which is modified by gradient fields generated by gradient coils, together with a rotating magnetic field ($B_1$) from a radio frequency (RF) antenna to excite nuclear magnetic resonances in the body that generate short term RF signals that are received to build up a tomographic image.

All current-generation MRI scanners employ arrays of local coils mounted in close proximity to the scanned patient to receive the RF with maximum possible signal to noise ratio (SNR). The local coils that receive signals from the back of the patient are mounted in the patient table. Local coils that receive signals from the front of the patient are arranged into 'mats' that are carefully placed over the patient. Associated with each mat is a flexible cable typically containing one co-axial line for each local coil. The cables interact with the $B_1$ field and with the signals generated from the patient so 'traps' (high impedance sections) must be included at regular (typically λ/8) intervals. These add cost and inconvenience to the structure. In use, the requirement to connect the cables and sterilise them between scanning one patient and the next leads to down-time between scans. Elimination of these cables is therefore desirable.

In co-pending UK patent application no. 0903722.7, corresponding to U.S. Ser. No. 12/612,831 filed Nov. 5, 2009, a wireless MRI system is described in which an array of antennas lining the MRI scanner bore is arranged to transmit a local oscillator (LO) signal that is received by antennas on the patient mat and fed therefrom to upconverters which upconvert magnetic resonance signals received from local coils in the patient mat and re-radiate them from the same antenna to be received at one or more of the bore array antennas for downconversion and processing to generate an MRI image.

However, wireless implementations give rise to new problems. When using a two port parametric amplifier in a wireless implementation, it is desirable that the parametric amplifier is entirely powered by an incident local oscillator signal at a microwave frequency.

SUMMARY OF THE INVENTION

In accordance with a first aspect of the present invention, a parametric amplifier device comprises a two port parametric amplifier, a DC voltage generator and a DC bias regulator, wherein the DC bias regulator has a voltage regulator, an attenuator and a summer, whereby output voltages from the regulator and the attenuator are added in the summer.

The DC voltage generator generates a DC signal for the DC bias regulator from an incident local oscillator signal and the DC bias regulator provides a bias voltage to the parametric amplifier.

Preferably, the device further has a power splitter

The power splitter is coupled between the antenna, the DC voltage generator and the parametric amplifier and splits the incident local oscillator signal between the DC voltage generator and the parametric amplifier.

Preferably, the attenuator and the summer have parallel resistive components.

Preferably, the attenuator has a non-linear function generator.

In accordance with a second aspect of the present invention, a wireless magnetic resonance imaging system has a local oscillator and transceiver array mounted in a bore of the system and a wireless local coil array and upconversion stage has a number of parametric amplifier devices according to the first aspect.

In accordance with a third aspect of the present invention, a method of determining a DC bias voltage requirement of a parametric amplifier in a circuit having a DC voltage generator, a power harvester and a DC bias regulator includes the steps of supplying an RF input, a DC bias voltage and a microwave local oscillator signal; measuring output power at one or both sidebands to determine gain in the parametric amplifier; and for each of a range of local oscillator signal strengths, measuring voltage output at the power harvester derived from the local oscillator signal; modifying the DC bias voltage to obtain a measured output power for a desired gain value; and plotting modified DC bias voltages against measured power harvester voltages to determine the required DC bias voltage requirement.

The present invention is part of a system that enables a wireless implementation of the patient coils.

DESCRIPTION OF THE PREFERRED EMBODIMENTS

The wireless concept to which the features of the present invention apply is based on upconversion, in the patient mat, of the RF (Larmor) frequency signals from the patient coils to microwave frequencies for transmission to microwave antennas located on the bore of the scanner. The combination of transmit and receive antennas on the patient and bore respectively constitutes a MIMO (Multiple Input/Multiple Output) system. The greater multiplicity of receive antennas in the bore array allows individual signals from a plurality of patient antennas to be resolved. The present invention relates to the upconversion process.

Figure 1:
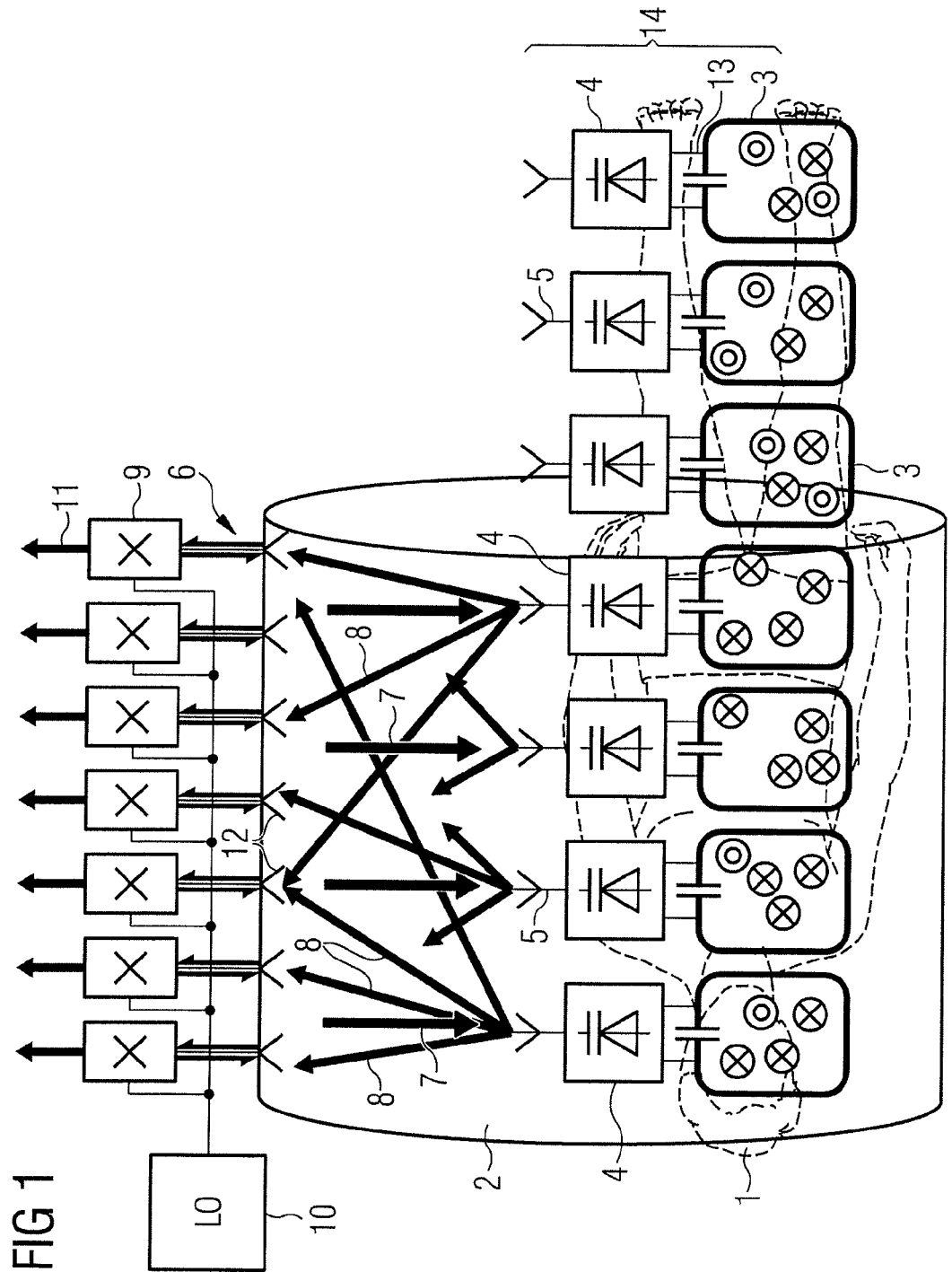
FIG. 1 illustrates an example of an MRI system incorporating parametric amplifier devices according to the present invention.

An example of an MRI system using a MIMO microwave link, in which amplifiers in accordance with the present invention are used, will now be described. FIG. 1 shows a patient 1 within an MRI scanner bore tube 2. A mat covers the part of the patient for imaging and embedded in the mat are a plurality of local coils 3. Associated with each local coil 3 is an upconverter stage 4 and microwave antenna 5. Transceivers 9, connected to an array 6 of antennas 12, are integrated into the scanner bore 2. The frequency upconverter 4 for each patient mat coil 3 produces signals for transmission to the array of transceivers in the scanner bore 2. A local oscillator (LO) signal at around 2.4 GHz, or other chosen microwave frequency, feeds the antenna array 6 to illuminate the patient coil electronics 14 with a signal 7 at the local oscillator frequency. Parametric amplifiers in the upconverter stage 4 use the incident local oscillator signal 7 to provide a frequency reference and power for upconversion. Magnetic resonance (MR) signals 13 from the coils are thereby converted to microwave frequency and transmitted to the bore transceiver antenna array 6. The same local oscillator signal in the transceivers converts the microwave signals 8, received from the patient coils 3 at the LO frequency±63 MHz, back to the original MR frequency of 63 MHz for input 11 to MR receivers in an image processing system (not shown.) The Larmor frequency $\omega 0$ is dependent upon the gyromagnetic ratio $\gamma$ and the magnetic field strength B0, so in the case of a 1.5 Tesla magnet, the MR frequency is 63.6 MHz, or for a 3 T magnet, the MR frequency is 123 MHz.

These values are commonly used magnet and MR frequencies, but magnets ranging from 0.5 T to 11 T could be used and the MR and local oscillator microwave frequencies may also be chosen from a much wider band. For example, dependent upon the nucleus type, the MR frequencies may range from 20 MHz to 500 MHz and the LO frequency might be chosen in the range of 1 GHz to 5 GHz.

The present invention uses a parametric amplifier circuit to carry out the mixing and amplification necessary for upconversion 4 of a radio frequency signal 13 received from each of the local coils 3.

Figure 2:
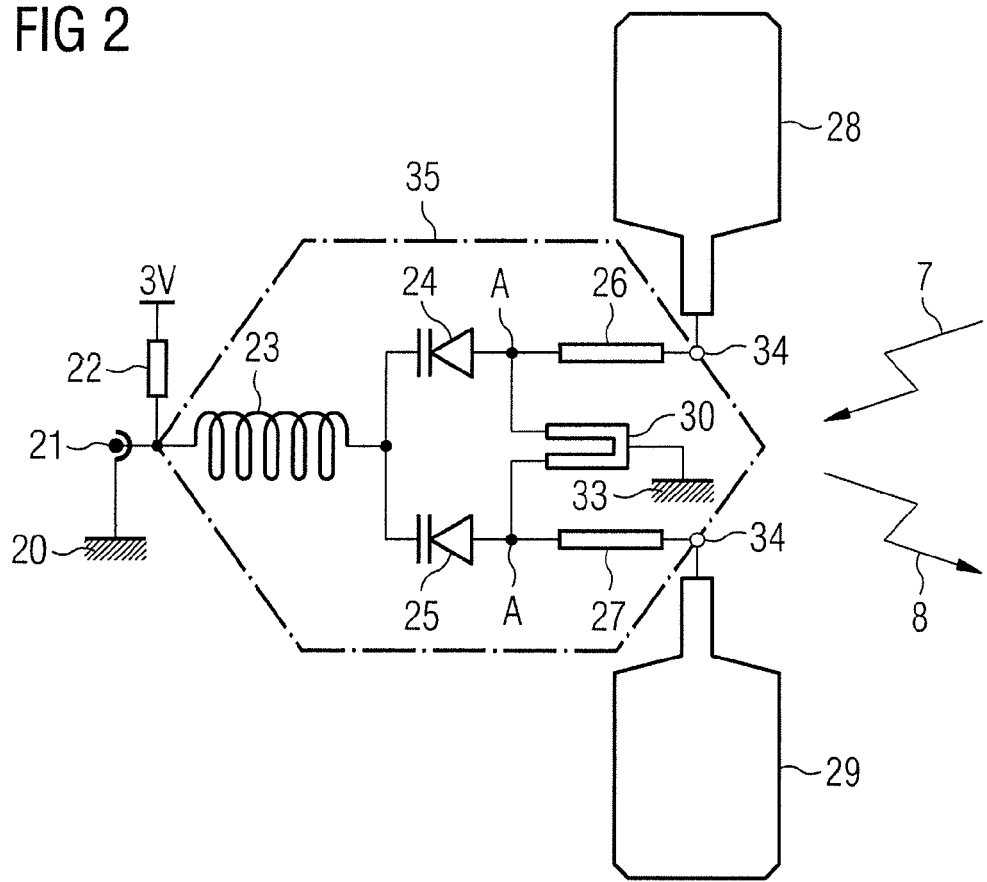
FIG. 2 illustrates in more detail, an example of a parametric amplifier for use in a parametric amplifier device according to the present invention in the system of FIG. 1.

An example of the parametric amplifier is shown in more detail in FIG. 2. FIG. 2 comprises a parametric amplifier core 35 provided with a single ended RF input 21 to receive the MR signal 13 from the local coil. A bias voltage 22 and an earth 20 are provided and a microwave port 34 at the output is connected to dipole antennas 28, 29 at the input. In this example, the magnetic resonance signal is at 63.6 MHz. The RF signal 13 is fed via a high Q RF input inductor 23 to drive a varactor diode pair 24, 25 in common mode parallel with 'earth return' via a shunt matching line pair 30 to ground connection 33. A high impedance (very low current requirement) voltage source provides the bias voltage 22 at e.g. 3V, via the high Q RF input matching choke 23 to the varactor diode pair 24, 25 (e.g. BBY53-02V) to set the correct operational capacitance bias point. Incident local oscillator (LO) 'pump' signal 7 (at a frequency for example of 2.44 GHz) received by the microwave antenna 28, 29 is input to the microwave port and fed via the appropriate printed microwave series matching lines 26, 27 and shunt matching lines 30 to provide differential drive (with centre ground 33) to the varactor diode pair 24, 25. This differential LO signal 7 mixes with the common mode RF drive signal 13 in the varactor diodes 24, 25 to produce microwave frequency lower side band (LSB) and upper side band (USB) products. These differential mode mixing products are fed back through the microwave matching lines 26, 27 and microwave port 34 to the microwave antenna 28, 29 for transmission back to the bore array of transceivers.

The two varactor diodes 24, 25 of the parametric amplifier circuit serve as an upconverter and an amplifier that requires no DC power supply, using directly the 'pump' signal 7 as a local oscillator and source of power. Parametric amplifiers are typically two port devices where a first port receives an input signal at a relatively low frequency to be upconverted and amplified and a second port both receives the pump signal at a relatively high frequency and outputs the relatively high frequency upconverted and amplified mixing product. Circulators are commonly used to separate the upconverted output signals from the incident LO drive signals, but these ferromagnetic based devices are not suitable for MRI applications because of the B0 field. Instead, re-radiated LSB/USB signals are separated from the incident LO in filters in the bore transceivers.

For this example, it is desirable that the pump signal 7 to the parametric amplifier core 35 should be received from an over-the-air transmission in order to remove any requirement for a DC power supply to the mat. The total bandwidth occupied by the upper and lower sidebands 8 and the pump signal 7 is typically small enough to fall within the efficient bandwidth of a single antenna. Thus, a two port parametric amplifier circuit is used, such that the first port 21 receives the input signal to be upconverted and amplified and the second port 34 receives the pump signal 7 and also outputs the upconverted and amplified input signal 8 at the upper and lower sideband frequencies.

The local oscillator signal 7 received by the dipole antenna 28, 29 from the bore array transmitters 9 arrives at the microwave port 34 at a power level of +10 dBm. This 'pump' signal is fed via the printed line matching 26, 27 to the varactor diode pair 24, 25. The common cathode configuration of the varactor diodes, with the anodes connected one to each half of the balanced feed from the dipole antenna 28, 29, results in antiphase stimulation of the varactor diodes at the LO (pump) frequency. RF stimulation via the RF input inductor 23 at the common cathode node leads to in-phase stimulation of the varactor diodes 24, 25 at the RF frequency. The resulting LSB and USB signals generated in each of the two varactor diodes are therefore in anti-phase. These wanted output signals, along with the greater (reflected) part of the incident LO signal 7, are then conveyed via the printed line matching 26, 27 back to the microwave port 34 and the dipole antenna 28, 29 where the signals 8 are broadcast into the bore 2 for reception by the bore receiver array system 6, 9, 10.

The high Q RF input matching choke 23 in series with the single ended RF input 21 is series resonant with the high capacitive reactance of the varactor diodes 24, 25 at the RF frequency. The earth return for the RF feed 21 is provided by the centre grounding 33 of the microwave port 34 shunt line. The centre-grounded shunt microstrip line resonates with the greater part of the high capacitive admittance of the varactor diodes 24, 25 at the microwave port frequency. The balanced pair of series lines 26, 27 then tunes out the remainder of the capacitive reactance of the varactor diodes and completes the impedance transformation to match to the 220 balanced load of the microwave dipole antenna 28, 29.

In this implementation, the diodes are connected in parallel for the RF feed, to halve the high impedance of the varactor diodes at 63.6 MHz RF for presentation at the RF port. The diodes are connected in series for the microwave port to double the very low impedance of the varactor diodes at 2.442 GHz for presentation at the microwave port. The series/parallel configuration lends itself to single ended RF drive, balanced microwave drive and two port operation. A single ended RF drive is appropriate at 63.6 MHz and is effected by means of drive through the RF input choke 23 and ground return 33 at the microwave port voltage node. A balanced microwave port is appropriate at 2.44 GHz for connection to a dipole antenna.

The microwave port operates fully balanced for LO "pump" feed at 2.442 GHz as well as for the output frequencies at 2.442 GHz±63.6 MHz. This obviates the need for any low impedance grounding in the microwave port circuits. Operation of the microwave port fully balanced suits perfectly connection to the balanced dipole antenna 28, 29 for reception of the LO signal 7 and re-radiation of the LSB and USB signals 8.

Figure 3:
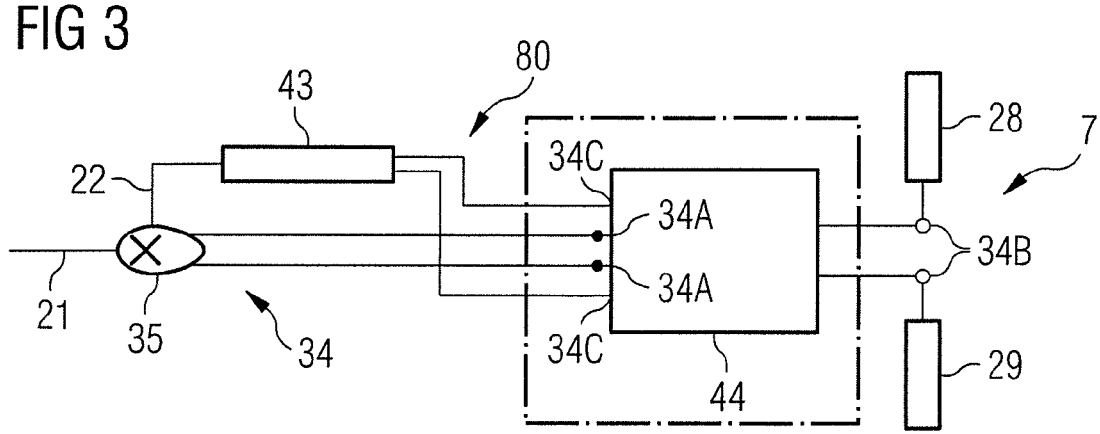
FIG. 3 illustrates an example of an upconverter in the system of FIG. 1, in more detail.

The design of this implementation is configured to allow high, in fact potentially infinite, "4-frequency" gain. This is a re-generative condition whereby RF frequency power that is produced in the generation of the LSB signal cancels with incident RF from the signal source to result in a reduced level of absorbed RF power for a given output and hence an increased gain. The correct power balance to achieve a controlled fixed gain is dependent on the precise tuning of the microwave port 34, which in turn is dependent on the bias voltage applied to the varactor diodes 24, 25, so uses a system for precise control of the bias voltage to achieve this control, and in addition to compensate for the dependence of the microwave port tuning on LO drive level A schematic of an upconverter is shown in FIG. 3. In the parametric amplifier device of present invention, the use of a power splitter 44 is optional. An RF input signal 21 from a local coil is input to a parametric amplifier core 35. A DC bias 22 applied to the parametric amplifier is supplied via a power harvester 43. The local oscillator signal 7 is received at the microwave antenna 28, 29 and applied to port 34B of the power splitter. The power splitter divides the signal and at output port 34C, one part 80 of the incident microwave signal 7 is coupled to the power harvester 43; at output port 34A, the other part is coupled to the microwave port 34 of the parametric amplifier.

Figure 4:
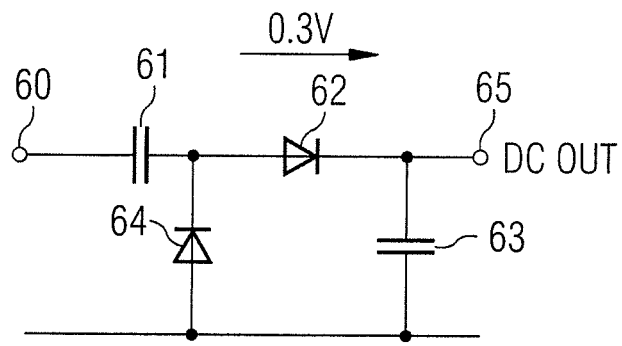
FIG. 4 shows a simplified power harvester circuit for use in the example of FIG. 3.

FIG. 4 illustrates a simplified power harvester circuit 43 in the form of a Cockcroft Walton voltage multiplier. An input signal 60 sees a low impedance at RF frequency (e.g. 2.4 GHz) in capacitor 61, which may be a 100 pF capacitor, but this capacitor provides a block at DC. When the voltage goes high, diode 62 starts to conduct, takes current and puts charge onto the upper plate of the other capacitor 63. When the voltage goes low, the first diode 62 is reverse bias and the other diode 64 is forward biased. This restores charge to the first capacitor 61. Over time, the effect is to produce a DC output at 65.

The parametric amplifiers 35 in a wireless coils MRI scanner receive their upconversion local oscillator 7 from their connected microwave antenna 28, 29 which is exposed to a microwave field, created by an array of transmitting antennas 12 that line the MRI scanner bore 2. Although every effort is made, through suppression of multipath and appropriate power weightings, to make the field strength at the parametric amplifier microwave antennas 28, 29 as uniform as possible, there will inevitably be some variability in the received local oscillator strength. The present invention aims to provide a design of parametric amplifier that mitigates the effects of varying local oscillator strength and that is completely powered by the incident RF field.

In a parametric amplifier device that uses a simple rectifier (power harvester 43) to provide the necessary DC reverse bias 22 to its varactor diodes 24, 25 several effects arise from the variation in local oscillator field strength. These effects are considered in terms of the response to an increase in local oscillator strength. For a given bias voltage, the dynamic capacitance of the varactor diodes increases. This leads to the tuned frequency reducing. If the bias is derived directly through rectification of the local oscillator then the bias voltage will increase. This would, at least partially offset the increase in the dynamic capacitance.

It might appear that the two effects would tend to cancel, leading to a reduced sensitivity to local oscillator strength variation. However, there is not, in general, a simple direct proportionality between the voltage generated by rectifying the local oscillator signal and the DC bias voltage required for the parametric amplifier, as the local oscillator level changes.

Co-pending UK patent application GB0915655.5, corresponding to U.S. application Ser. No. 12/726,567, filed simultaneously herewith, (now U.S. Pat. No. 8,415,951) addresses the problem of coupling between the resonant circuit at the output of the parametric amplifier 35 and the available local oscillator signal strength for DC bias generation by using a power splitter 44. The present invention addresses the problem of variation of incident local oscillator power by introducing a regulator 82 between the rectifier 43 and the DC bias input 22 of the parametric amplifier 35. This removes the direct dependency of the DC bias on the local oscillator strength. An additional feature is to add a controlled dependency of DC bias 22 to the voltage 81 at the input to the regulator. This controlled dependency may include a defined non-linear relationship between these voltages.

Figure 5:
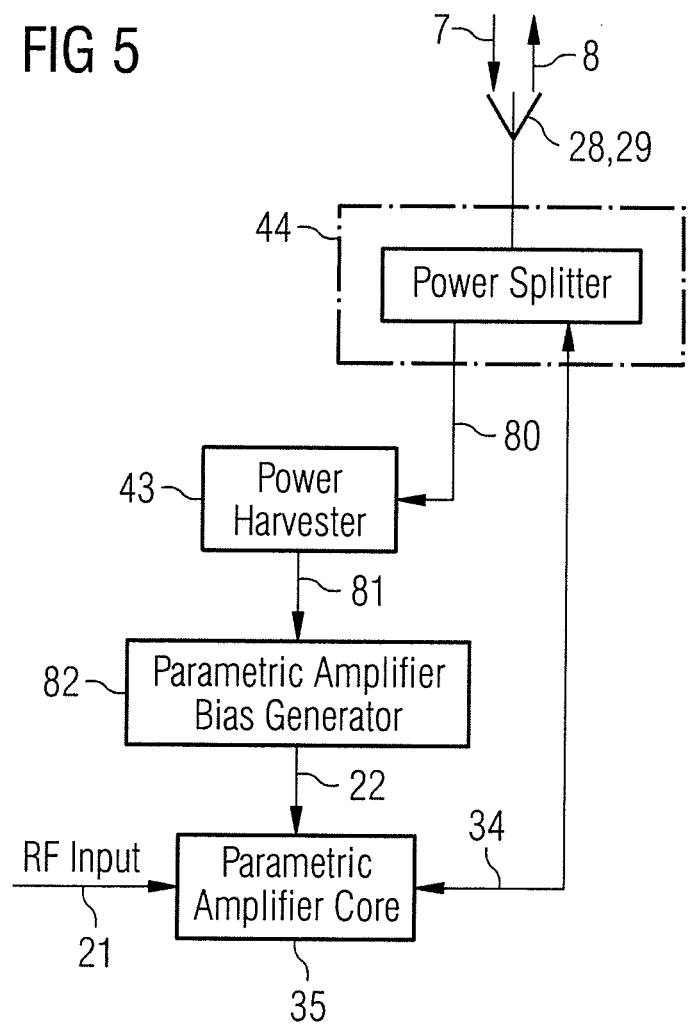
FIG. 5 is a block diagram of an example of a parametric amplifier device with adaptive biasing according to the present invention.

An example of a basic architecture of a parametric amplifier device according to the present invention is shown in FIG. 5. A local oscillator signal 7 is received at a microwave antenna 28, 29. The same antenna returns an upconverted signal 8 to the bore antennas. An optional power splitter 44, such as a Wilkinson splitter, or directional coupler may be provided to split the incident LO signal power in a desired ratio between a single port input/output of the parametric amplifier core 35 and a DC voltage generator 43, generally referred to as a power harvester, which generates DC by rectifying an input RF signal 80 to produce a DC signal 81. The DC output 81 passes through a bias regulator 82, generally referred to as a parametric amplifier bias generator and generates the bias voltage 22 which is applied to the parametric amplifier core 35. The power splitter 44 may be of the type described in the aforementioned co-pending patent application Ser. No. 12/726,567 (now U.S. Pat. No. 8,415,951) and with respect to FIG. 3 above, with the benefit that the power available is not influenced by the varying LO power. However, the present invention does not depend on the inclusion of a power splitter. The power harvester 43 may incorporate a resonant voltage transformation circuit and/or a Cockcroft-Walton voltage multiplier as necessary to obtain the required output voltage. The parametric amplifier bias generator 82 is interposed between the power harvester DC output and the bias voltage input of the parametric amplifier core 35.

The compensation provided by the parametric amplifier bias generator 82 depends on three relationships. The relationship between the local oscillator strength and the parametric amplifier tuned frequency, the relationship between the local oscillator strength and the rectified voltage 81 at the output of the power harvester 43, and the relationship between the parametric amplifier DC bias voltage 22 and the parametric amplifier output tuned frequency as a function of the local oscillator strength.

Figure 6:
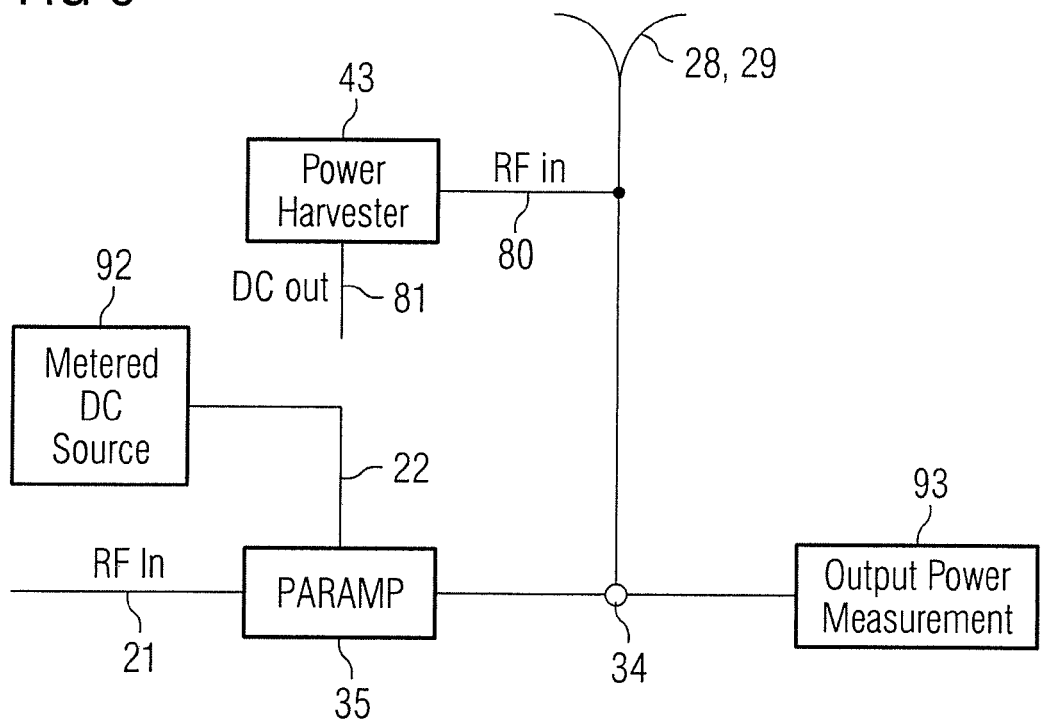
FIG. 6 is a block diagram of a test arrangement for carrying out a method according to the present invention.

One method whereby the required bias generator characteristic may be determined is to perform measurements, either on real hardware, or in simulation. A test configuration is established where an RF signal is fed to the RF input 21 of the parametric amplifier 35 and the output power at one or both of the sidebands is measured 93 in such a way that the gain of the parametric amplifier can be determined. In view of the bidirectional nature of the parametric amplifier microwave port 34 the measurement may require the use of a circulator, or other suitable isolating device. In this test configuration (shown in FIG. 6), the parametric amplifier DC bias is provided from a metered external source 92. For each of a number of local oscillator strengths, spanning the desired range, the parametric amplifier DC bias voltage 22 is adjusted so that the upconverted microwave power measured 93 at the parametric amplifier port 34 is commensurate with the desired upconversion gain. To get a high gain of the order of 20 to 25 dB, there needs to be fine tuning to avoid instability. At the same time, and for each of the same local oscillator strengths, the power harvester output voltage 81 is also measured. This method of measurement is particularly advantageous because the power harvester voltage 81 is measured under the exact conditions that it will see when the parametric amplifier bias generator 82 is achieving effective compensation. Although the use of a power splitter 44 as proposed in the aforementioned co-pending application Ser. No. 12/726,567, filed simultaneously herewith, (now U.S. Pat. No. 8,415,951) provides substantial isolation from parametric amplifier impedance changes, there may still be some residual effect.

Figure 7:
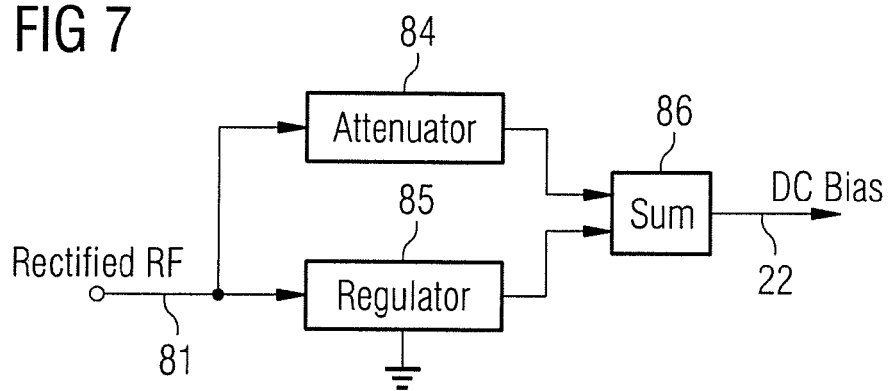
FIG. 7 illustrates an example of parametric amplifier bias generator architecture for the device of FIG. 5.

The required characteristics of the bias generator 82 can be obtained by plotting the adjusted parametric amplifier DC bias voltages 22 against the measured power harvester output voltages 81. If the measured characteristic is close enough to an offset linear relationship that acceptable compensation of local oscillator power variations can be achieved on this basis, then a bias regulator 82 having the architecture shown in FIG. 7 may be used. In FIG. 7, the rectified RF output 81 from the power harvester 43 passes through an attenuator 84 and regulator 85 connected to ground. Outputs from both the attenuator and regulator are summed 86 to produce the DC bias voltage 22 for the parametric amplifier.

The architecture of FIG. 7 contains a circuit with the functionality of a conventional three terminal voltage regulator. This may be implemented using discrete components in order to achieve the necessary characteristics, particularly that of low current to ground. The configuration complexity can range from a simple combination of reference diode and resistor through to active circuitry.

Figure 8:
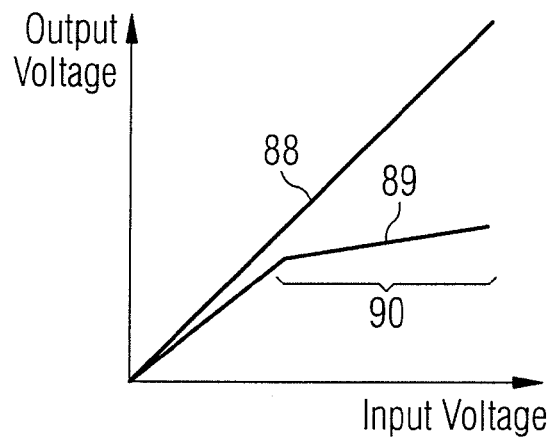
FIG. 8 illustrates a parametric amplifier bias generator characteristic for the device of FIG. 5.

The regulator 85 gives an output voltage that is independent of its input voltage for a range of input voltages. Initially, the output follows the input, but when a predefined limit is reached, the output voltage remains at that average value. To get the output to continue to increase, attenuation is applied. The attenuation circuits may also be given non-linear characteristics to obtain a curve, rather than a straight line characteristic. However, for the purposes of compensation of local oscillator power variation we require some dependency between the output voltage and the input voltage. In order to achieve this, the configuration of FIG. 7 also incorporates a path that bypasses the regulator. Here the input voltage is attenuated in attenuator 84 and added 86 to the regulator output. This creates a DC bias voltage 22 that depends on the rectified input voltage 81, but not directly. A representative characteristic is shown in FIG. 8.

For comparison the straight line 88 of a direct connection is shown. For the bias generator 82, the output voltage 22 increases as the input voltage 81 increases until the point of regulation 91 is reached. The exact relationship between input and output voltage over this range depends upon the details of the implementation of the regulator but it is generally monotonically increasing. For any input voltage 81 higher than the point of regulation 91 the bias generator 82 can be in its range of compensation 90. The relationship between input and output is linear, but offset from the origin.

Figure 9:
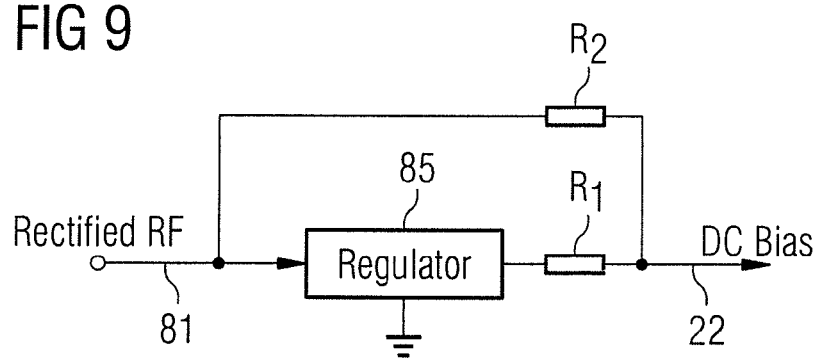
FIG. 9 illustrates a simple implementation of the parametric amplifier bias generator of FIG. 7.
Figure 10:
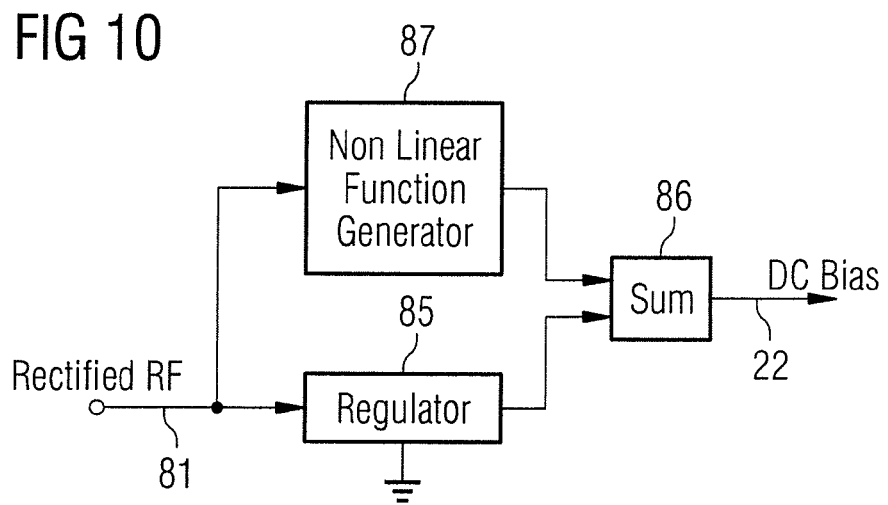
FIG. 10 shows an example of a parametric amplifier bias generator with non-linear compensation.

The attenuator 84 and summer 86 shown in FIG. 7 can be implemented very simply as illustrated in FIG. 9. Here two resistors R1, R2 provide both the attenuation and summing characteristic. If the ideal input output relationship for the bias generator 82 is too far from linear to permit a viable linear approximation, then the architecture of FIG. 10 may be used. In FIG. 9, a non linear function generator 87 replaces the attenuator 84 of FIG. 7. This may be implemented using a combination of diodes and resistors as is well known in the art.

Although modifications and changes may be suggested by those skilled in the art, it is the intention of the inventors to embody within the patent warranted hereon all changes and modifications as reasonably and properly come within the scope of their contribution to the art.

We claim as our invention:

1. A parametric amplifier device comprising:
   a two port parametric amplifier comprising a parametric amplifier core, the parametric amplifier core having an RF input and a microwave input/output and a DC bias voltage input, said parametric amplifier being configured to use a DC bias input received at said DC bias voltage input to amplify an RF input signal received at said RF input in order to produce a microwave output signal at said microwave input/output;
   a DC voltage generator that generates a DC voltage; and
   a DC bias regulator circuit connected between said DC voltage generator and said DC bias voltage input of said parametric amplifier core, said DC bias regulator circuit comprising a circuit input supplied with said DC voltage from said DC voltage generator, a summing unit, and an attenuator and a regulator connected in parallel between said circuit input and said summing unit, said regulator being configured to non-linearly regulate said DC voltage and said attenuator attenuating said DC voltage, with a sum of the attenuated DC voltage and the non-linearly regulated DC voltage, produced in said summing unit, forming said DC bias signal, said DC bias signal being independent of said DC voltage for a range of said DC voltage, thereby causing said DC bias signal to be only indirectly dependent on said DC voltage.

2. A parametric amplifier device as claimed in claim 1 further comprising:
   a transmitting and receiving antenna; and
   a power splitter connected between said antenna and said power harvester and between said microwave input/output of said parametric amplifier core and said antenna.

3. A parametric amplifier device as claimed in claim 2 wherein said DC voltage generator is a power harvester.

4. A parametric amplifier device as claimed in claim 1 wherein said attenuator in said DC bias regulator circuit is a non-linear function generator.

* * * * *